United States Patent

[11] 3,602,635

[72] Inventor Lubomyr T. Romankiw
Millwood, N.Y.
[21] Appl. No. 51,189
[22] Filed June 30, 1970
[45] Patented Aug. 31, 1971
[73] Assignee International Business Machines Corporation
Armonk, N.Y.

[54] MICRO-CIRCUIT DEVICE
5 Claims, 4 Drawing Figs.

[52] U.S. Cl. ........ 174/68.5, 29/604, 29/625, 117/212, 317/101 B, 340/174 TF
[51] Int. Cl. ........ H05k 1/02
[50] Field of Search ........ 174/68.5; 317/101 A, 101 CX, 101 CM, 101 D, 234 M, 234 N, 234 S; 340/174 TF; 29/578, 604, 625

[56] References Cited

UNITED STATES PATENTS 3,525,617 8/1970 Bingham ........ 29/625 X
3,533,160 10/1970 Cunningham et al. ........ 317/234 J UX

*Primary Examiner*—Darrell L. Clay
*Attorneys*—Hanifin and Jancin and Isidore Match

ABSTRACT: A microcircuit device such as a printed circuit or an integrated circuit is described wherein the thickness of insulation between two crossing conductive bodies can be substantially decreased as compared to the corresponding thickness in known like devices. In the case for example, such as magnetic coupled film memory devices wherein a low temperature insulating material can be employed and wherein such insulating material is subject to surface tension effects, this is achieved by retaining the photoresist layer on the surface of the metal magnetic bodies resting on the substrate and etching the magnetic bodies to the point where the width of the upper surfaces of the conducting bodies are equal to the width of the nonconductive resist used in the etching or where there is a slight undercut under their retained respective photoresist layers, i.e., the layer on each body extends beyond the perimeter of the surface of the bodies. Such photoresist layer protects sharp metal corners or, in the latter case, provides an umbrella effect in that it extends beyond the sharp edges of the magnetic bodies, the latter being potential areas for electrical shorts. In the case where conductive bodies are employed which generate high temperatures or which have to withstand high service temperatures and wherein correspondingly high temperature insulating materials have to be used or in which it is desired to have very thin hard insulations such as are produced in the use of inorganic insulations, glasses and the like, the aforementioned "umbrella" effect is provided by a layer of high temperature insulating materials of organic or inorganic compositions on the conducting body's surface rather than the layer of photoresist material. In this latter case, the insulation thickness can be much thinner than the commonly accepted rule of thumb thickness which is twice that of the conducting bodies for conducting bodies of 30000A. or thicker and even greater such as four or five to one for conducting bodies considerably thinner than 3000A. (for example, 200 to 500A. thick).

INVENTOR
LUBOMYR T. ROMANKIW

BY Isidore Match

ATTORNEY

MICRO-CIRCUIT DEVICE

BACKGROUND OF THE INVENTION

This invention relates to printed circuit devices and integrated circuit devices. More particularly, it relates to a novel circuit device wherein there is enabled the use of very thin insulation between conductive crossing lines or conductive bodies.

In the fabrication of printed circuit devices, such as microminiaturization of magnetic memory devices to permit the maximum interaction between the thin magnetic film on the bit sense lines and the magnetic fields created by the word lines of two crossing lines, or opposing magnetic bodies, an impediment to such interaction has been in a microminiature coupled film device the need for relatively thick insulation therebetween which has resulted in high word line currents and low packing magnetic array packing density. For example, the current carrying lines, such as bit-sense lines in bulk memory arrays or microminiature magnetic coupled film memories, have to be separated from word lines by a very thin insulation. In presently known manufacturing techniques, the bit sense lines in such memory arrays are formed by chemical photoetching techniques. In these techniques, the photoresist is removed and insulation may then be applied by any known process such as spinning, spraying, dipping, screening or the like.

In some magnetic devices formed by such chemical photoetching technique, there is permitted the use of a relatively low temperature polymer as the insulation. However, because of the surface tension effects inherent in the polymer, the sharp edges of a bit sense line may break through the polymer and become potential areas for electrical shorts.

In the known processes for manufacturing photoetched semiconductor devices, a relatively low temperature material cannot be used as the insulator between conductive elements. Here, instead, there has to be used a high temperature dielectric material such as silicon dioxide, silicon nitride, borosilicate glass or other material such as a polymer having a relatively high service temperature. In this type of device, i.e., wherein there has to be used this high-temperature dielectric material, there has evolved an empirical rule of thumb as to the thickness of the insulating layer. This rule is that the thickness of the insulation has to be at least twice that of the thickness of the conducting body when the body is thicker than about 3000A. and three to five times thicker when the body is 200 to 500A. thick. If the insulation is not made this thick, then pores in the insulation appear contiguous to the sharp edges of the conducting body, and here again, potential areas for shorts are provided.

Accordingly, it is an important object of this invention to provide a printed circuit device or an integrated circuit device wherein there is enabled the use of insulation thicknesses between crossing conductive lines, or opposing conductive bodies which are substantially less than has heretofore been possible without danger of shorts occurring therebetween.

It is another object to provide a printed magnetic device in accordance with the preceding object, which permits the employment of a relatively low temperature insulating material therein.

It is a further object to provide a printed circuit device wherein there has to be used relatively high temperature insulating material, without the requirement that the thickness that the insulating material be substantially twice the thickness of the conductive body being insulated thereby, when the conductive body is more than 3000A. thick, and without the requirement that the insulation be three to five times the thickness of the conducting body when the conducting body is only 200 to 500A. thick.

SUMMARY OF THE INVENTION

Generally speaking, and in accordance with the invention, there is provided a microcircuit device comprising a first layer of conducting bodies, a relatively thin insulating coating on the surface of said first layer, the width of the top surface of the bodies being not greater than the width of the insulation and preferably the top surface of the conducting bodies being slightly undercut directly beneath the insulating coating whereby the insulating coating on the bodies overhang their respective surfaces, an insulating material between the bodies and on the insulating coating, and a second layer of conducting bodies on the insulating material.

The foregoing and other objects, features and advantages of the invention will be apparent from the following more particular description of preferred embodiments of the invention, as illustrated in the accompanying drawings.

DESCRIPTION OF PREFERRED EMBODIMENTS

Figure 1:
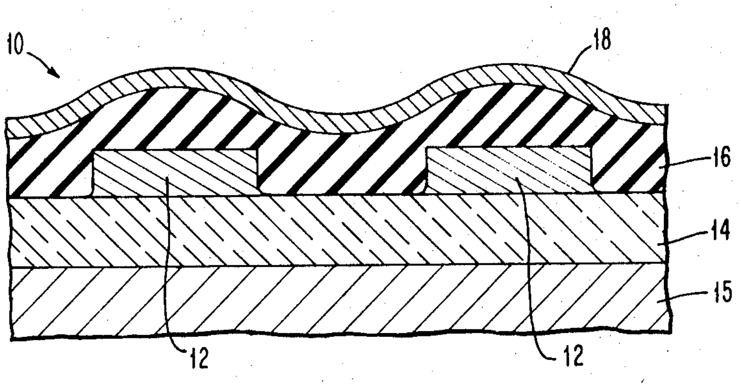
FIG. 1 PRIOR ART
FIG. 1 is a cross section of the known printed circuit device wherein there may be used a relatively low temperature insulating material.

Referring to FIG. 1 wherein there is shown a known printed circuit magnetic device 10, such device is shown in its final completed form. Device 10 may have suitably been formed by applying a positive resist to underlying bit-sense lines, covering the desired areas on the photoresist with a suitable mask, exposing resist to ultraviolet light, developing the resist, etching the metal with an etchant such as ferric chloride or any other equivalent etchant, removing the resist and then applying the low temperature insulation on the etched metal, the insulation being the known type of low temperature dielectric material such as a polymer suitable for the purpose and being applied by known techniques such as spinning, spraying, screening, dipping, etc. The conducting structure used as the word line is then placed on top of the insulation, also by a suitable technique such as sputtering, spraying, etc.

In FIG. 1, device 10 in its final manufactured form, accordingly comprises the bit-sense line portions 12 lying on a suitable substrate 14 such as SiO, $SiO_2$ organic insulator which in turn is on a metal ground plane 15. Such portions 12 in a magnetic device may suitably comprise copper conductors clad with a magnetic thin film such as nickel-iron. The insulation 16 is of a relatively low temperature dielectric material. The conductor 18 lying on the insulating material which, in the magnetic array, is the word line, is a structure similar to the portions 12 except that the copper conductor therein is only clad on three sides with the nickel-iron thin film. The bottom side thereof, i.e., that lying on the insulation and opposing the upper surfaces of bit-sense portions 12, is not clad with the magnetic film.

It is to be noted that the insulation in the device of FIG. 1, although quite thick on top of line 12 and in between the lines, is quite thin near the corners of the conducting lines, and, accordingly, of necessity, word line 18 on average is appreciably spaced from bit-sense line portions 12. Such high degree of spacing and variation in spacing thickness is undesirable. Were insulation not provided in such thickness, the danger would occur that, because of surface tension effects in the low temperature insulation, the sharp edges of the bit-sense line portions could become potential areas for electrical shorts.

Figure 2:
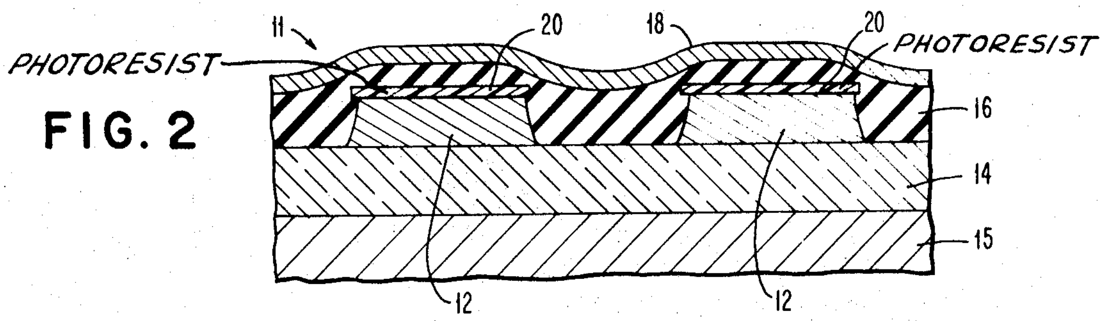
FIG. 2 is a cross section of a printed circuit device instructed in accordance with the principles of the invention wherein there can be employed a relatively low temperature insulating material.

In the microcircuit device 11 shown in FIG. 2, this problem presented in the use of the device of FIG. 1 is overcome. This overcoming is achieved by first completing the same steps in the fabrication of the device of FIG. 2 as is done in the manufacture of the device of FIG. 1 up to the point where, after the resist has been developed, the metal 4*etched. At this point, the etching of the metal continues until an undercut is formed in the metal near the perimeter on of the photoresist material. Thereby, the overhanging photoresist layer 20 effectively forms an umbrella whose area is greater than the area of the surface of the metal body i.e., the bit sense line portion 12 upon which it rests. At this point, the photoresist material rather than being removed as it is in the fabrication of the device of FIG. 1, is baked on by baking the device at a suitable temperature, such as* 150 to 200° C for example. With photoresist layer 20 completely polymerized (stabilized by heat) now and firmly attached to the surface of bit-sense portions 12 by the baking, the insulation which may be of the same material as insulation 16 of the device of FIG. 1 is applied in a much lesser quantity whereby the spacing caused by insulation thickness between bit sense portions 12 and word line 18 is substantially less than the corresponding spacing in the device of FIG. 1. It is readily appreciated that the overhang of photoresist layer 20 completely protects insulation 16 from the sharp edges of bit-sense line portions 12 whereby no shorts can occur in the vicinity of these edges, even if the second insulation were to be so thin that the edges became exposed due to surface tension effects.

Figure 3:
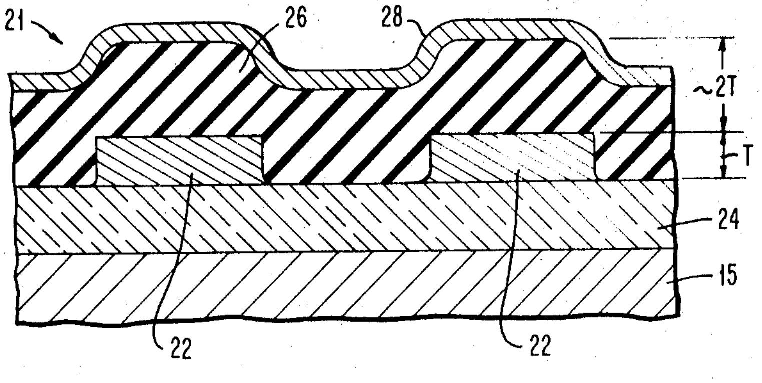
FIG. 3 PRIOR ART
FIG. 3 is a cross section of a known printed circuit device wherein there is required a relatively high temperature insulating material.

The device 21 of FIG. 3 is the known prior art printed circuit device wherein there are employed conducting bodies whose temperatures during operation rise to a point where they might deleteriously affect a low temperature-type dielectric material. If it is assumed that device 21 is used for the same purpose as that of FIGS. 1 and 2, i.e., a portion of a microminiature memory array, then the bit sense line portions 22 therein suitably comprise a permalloy, copper, permalloy sandwich with suitable diffusion or germanium barriers therebetween which lie on a substrate 24, such as glass or other insulating material layer under which there is a metal ground plane. Insulating material 26, because of the high temperature operating characteristics for bit-sense lines portion 22 fabricated with diffusion barriers therebetween is preferably of a high temperature-type. Suitable examples of such insulation are silicon dioxide, silicon nitride, aluminum oxide, a high temperature polymer, etc. In the case of semiconductor devices, integrated circuit devices or microminiature packages, line 22 may be Mo, W, Al, Cu-Al, Cr-Ag-Cr, or other type of conductor or conductor sandwich. Line 28 can also be of a conducting metal similar to that of line 22 while insulation 26 can be $SiO_2$, SiO, $Al_2O_3$, $Si_3N_4$ and the like high temperature insulations.

It is to be noted in the device of FIG. 3 that insulation 26 has a thickness which is approximately 2T, i.e., about twice the thickness T of semiconductor bodies 22. As has been stated above, it has been empirically accepted in the printed circuit and integrated circuit device art that the thickness of the insulation material in this type of the conducting body when a high temperature type dielectric material is used for the insulation. Clearly, the need for such thickness of insulation negates the possibility of decreasing the spacing between two crossing conductive lines or opposing conductive bodies in the device. The device 23 of FIG. 4, constructed in accordance with the principles of the invention, overcomes the problem presented by the use of the device of FIG. 3 in that the thickness of the insulation of the device of FIG. 4 can be substantially less than that of the device of FIG. 3.

Figure 4:
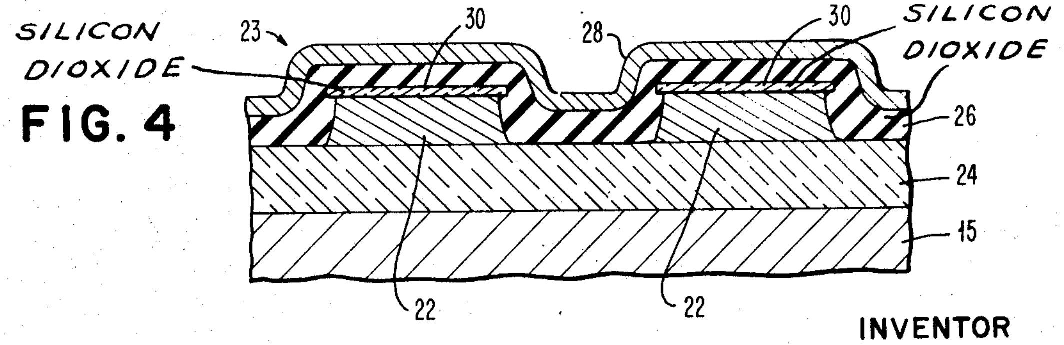
FIG. 4 is a cross section of a device constructed according to the invention wherein there has to be utilized a relatively high temperature insulating material.

In the fabrication of the device shown in FIG. 4, a layer of silicon dioxide 30 or other high temperature insulating material is laid down on the surface of the conductive layer, the latter being an insulating material, which will eventually become bit-sense line portions 22. A photoresist layer, which may be of the positive or negative type, is provided upon the insulating layer 28. The device is then suitably masked and exposed to ultraviolet light, and the resist is developed.

A separate etchant is employed to etch the insulating layer, an example of such etchant being hydrofluoric acid or ammonium hydroxide buffered hydrofluoric acid when silicon dioxide is used as insulation. The conducting material between the bit-sense line portions is etched with ferric chloride or other suitable etchant, dependent upon the conduction material. Here again, the etching is continued so that the double layer of the photoresist and the insulating material extends beyond the perimeter of the upper surface of the bit-sense line portions to provide the "umbrella" thereover. At this juncture, different from the fabrication of the device of FIG. 2, after the etching step, the remaining photoresist material is removed from the surface of the insulating material on the bit-sense line portions. Thereafter, insulation 26 is applied and word sense line conductor 28 is placed on the insulation.

It is seen that in the comparison of the devices of FIG. 3 and FIG. 4, the umbrella effect provided by insulation layer 30 protects insulation 26 from the sharp edges of the upper surface of bit-sense line portions 22 whereby insulation 26 does not have pores formed therein to provide areas for potential shorts or corrosion sites.

In carrying out the invention, the following examples are provided.

EXAMPLE 1

A plurality of 1 mil lines on 2 mil centers which were 5,000A. thick and made of permalloy clad copper were insulated from a plurality of 1 mil wide copper lines on 2 mil centers using KTFR, which is the trade name of a negative photoresist manufactured by the Eastman Kodak Co. of Rochester, New York (as used to produce the devices shown in FIGS. 1 and 2). When the technique set forth in the description of the fabrication of the device of FIG. 1 was used and the thickness of the KTFR photoresist lying on lines 12 was about 1.0$\mu$, about 50 percent of the $10^4$ crossings were shorted between lines 12 and lines 18. When the same thickness lines with the same thickness of KTFR between lines 12 and 18 were used according to the inventive arrangement shown in FIG. 2, 99.9 percent, i.e., substantially all of $10^4$ crossings were free of shorts.

EXAMPLE 2

In the formation of a magnetorestrictive transducer, when a plurality of 200A. thick permalloy bars which were 0.4 mil wide and 10 mils long were formed and insulated either with sputtered silicon dioxide or Emulsitone type (a silica or borosilica film manufactured by Emulsitone Co. of Livingston, New Jersey) borosilicate glass in the arrangement according to FIG. 4, with approximately 500A. of insulation, an excellent yield was similarly obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A microcircuit device comprising a first layer of conducting bodies, a relatively thin insulating coating on the surfaces of said bodies, said bodies being slightly undercut directly beneath said insulating coating with the coatings on said bodies overhanging said bodies, an insulating material between said bodies and on said insulating coating, and a second layer of conducting bodies on said insulating material.

2. A microcircuit device as defined in claim 1, wherein said first layer of conducting bodies are of a magnetic material, conductor, magnetic material sandwich, said insulating material is of a relatively low temperature dielectric material and said insulating coating is of a photoresist material.

3. A microcircuit device as defined in claim 1, wherein said first layer of conducting bodies are selected from the group consisting of a single metal and a metal sandwich separated by diffusion barriers, said insulating material is of a relatively high temperature dielectric material, and wherein said insulating coating is also of a relatively high temperature dielectric material.

4. A microcircuit device as defined in claim 3, wherein the portions of said insulating material overlying said first layer of conductive bodies has a thickness which is substantially less than twice the thickness of said conducting bodies of said first layer.

5. A microcircuit device as defined in claim 1, wherein said insulating material and said insulating coating are both silicon dioxide.